US008479922B2

(12) United States Patent
Kennedy

(10) Patent No.: US 8,479,922 B2
(45) Date of Patent: Jul. 9, 2013

(54) SHIELDABLE BAG SYSTEM AND DEVICES

(76) Inventor: Linda Kennedy, Park City, UT (US)

( * ) Notice: Subject to any disclaimer, the term of this patent is extended or adjusted under 35 U.S.C. 154(b) by 0 days.

(21) Appl. No.: 13/385,498

(22) Filed: Feb. 21, 2012

(65) Prior Publication Data

US 2012/0195530 A1 Aug. 2, 2012

Related U.S. Application Data

(63) Continuation-in-part of application No. 13/181,673, filed on Jul. 13, 2011, which is a continuation-in-part of application No. 13/166,517, filed on Jun. 22, 2011, now abandoned, which is a continuation-in-part of application No. 12/383,348, filed on Mar. 23, 2009, now abandoned.

(60) Provisional application No. 61/072,986, filed on Apr. 4, 2008.

(51) Int. Cl.
*B65D 30/08* (2006.01)

(52) U.S. Cl.
USPC .......................................... 206/720

(58) Field of Classification Search
USPC ......... 383/37, 109, 111, 113, 88, 92; 206/720
See application file for complete search history.

(56) References Cited

U.S. PATENT DOCUMENTS

| | | | | |
|---|---|---|---|---|
| 2,037,175 A * | 4/1936 | Northcross | ................... | 493/210 |
| 2,051,903 A * | 8/1936 | Royal | ........................... | 383/106 |
| 2,756,154 A * | 7/1956 | Mahaffy | ...................... | 426/106 |
| 2,757,855 A * | 8/1956 | Allen | ............................... | 383/90 |
| 3,214,080 A * | 10/1965 | Wolfson | .......................... | 383/11 |
| 3,394,871 A * | 7/1968 | Williams et al. | ................ | 383/44 |
| 3,511,435 A * | 5/1970 | Cawley et al. | ................. | 383/107 |
| 3,554,368 A * | 1/1971 | Nagel | ........................... | 206/471 |
| 3,733,024 A * | 5/1973 | Bolling et al. | ................ | 383/109 |
| 4,328,895 A * | 5/1982 | Jaeger | ........................... | 206/496 |
| 4,364,474 A * | 12/1982 | Hollander, Jr. | ................ | 206/219 |
| 4,593,736 A * | 6/1986 | Morita | .......................... | 150/147 |
| 4,890,936 A * | 1/1990 | Cooper | ......................... | 383/109 |
| 4,951,666 A * | 8/1990 | Inman et al. | .................. | 607/114 |
| 5,007,233 A * | 4/1991 | Bose | .............................. | 53/449 |
| 5,472,279 A * | 12/1995 | Lin | .................................. | 383/2 |
| 5,571,973 A * | 11/1996 | Taylot | ..................... | 73/862.046 |
| 5,791,485 A * | 8/1998 | Carbonneau | .................. | 206/720 |
| 5,894,975 A * | 4/1999 | Holden et al. | ................ | 224/582 |
| 6,022,144 A * | 2/2000 | Hausslein | ....................... | 383/33 |
| 6,068,401 A * | 5/2000 | Ho | .................................. | 383/97 |
| 6,139,188 A * | 10/2000 | Marzano | ....................... | 383/110 |
| 6,200,029 B1 | 3/2001 | Bonta | | |
| 6,210,037 B1 * | 4/2001 | Brandon, Jr. | .................. | 383/111 |

(Continued)

*Primary Examiner* — Steven A. Reynolds
*Assistant Examiner* — King M Chu
(74) *Attorney, Agent, or Firm* — James R Bell

(57) ABSTRACT

One embodiment of the present disclosure provides a shielding apparatus including a double-lined container having an outer pocket and an inner pocket mounted within the outer pocket. The inner and outer pockets each form an enclosure having a continuous closed edge interrupted by an opening. The continuous closed edge of the outer pocket is adjacent the continuous closed edge of the inner pocket, and the opening of the outer pocket is adjacent the opening of the inner pocket. The adjacent openings are interconnected and include a device for simultaneously opening and closing the interconnected adjacent openings. A first plurality of stitches and folds are included in the continuous closed edge of the inner pocket and a second plurality of stitches and folds are included in the continuous closed edge of the outer pocket.

9 Claims, 4 Drawing Sheets

U.S. PATENT DOCUMENTS

| | | | |
|---|---|---|---|
| 6,491,433 B2 * | 12/2002 | Shabram et al. | 383/100 |
| 6,784,363 B2 * | 8/2004 | Jones | 174/351 |
| 6,805,486 B2 * | 10/2004 | Smith et al. | 383/92 |
| 6,821,019 B2 * | 11/2004 | Mogil | 383/110 |
| 7,106,202 B2 | 9/2006 | Dickinson | 340/572.8 |
| 7,601,921 B2 | 10/2009 | Schroader | |
| 7,674,041 B2 * | 3/2010 | Frayne | 383/101 |
| 2003/0002755 A1 * | 1/2003 | Kim et al. | 383/119 |
| 2003/0052035 A1 * | 3/2003 | Dickinson | 206/522 |
| 2003/0052786 A1 * | 3/2003 | Dickinson | 340/572.8 |
| 2004/0008908 A1 * | 1/2004 | Shepard | 383/89 |
| 2007/0189639 A1 * | 8/2007 | Revness | 383/37 |
| 2008/0226207 A1 * | 9/2008 | Frayne | 383/109 |
| 2009/0056279 A1 * | 3/2009 | Sasaki | 53/449 |

\* cited by examiner

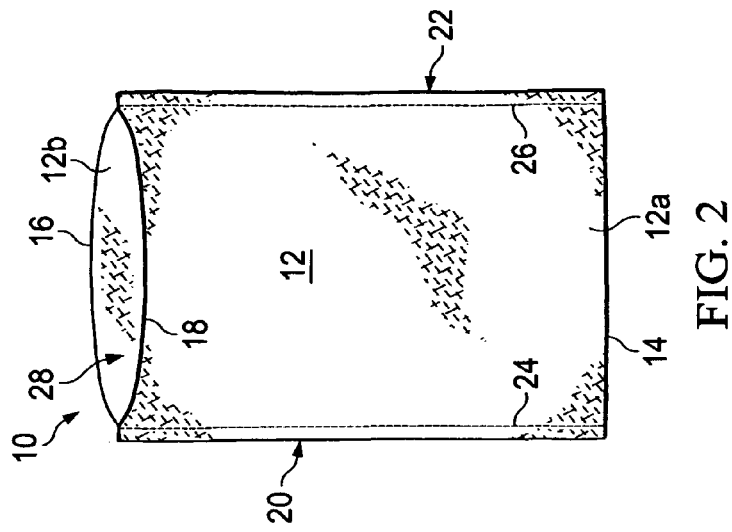
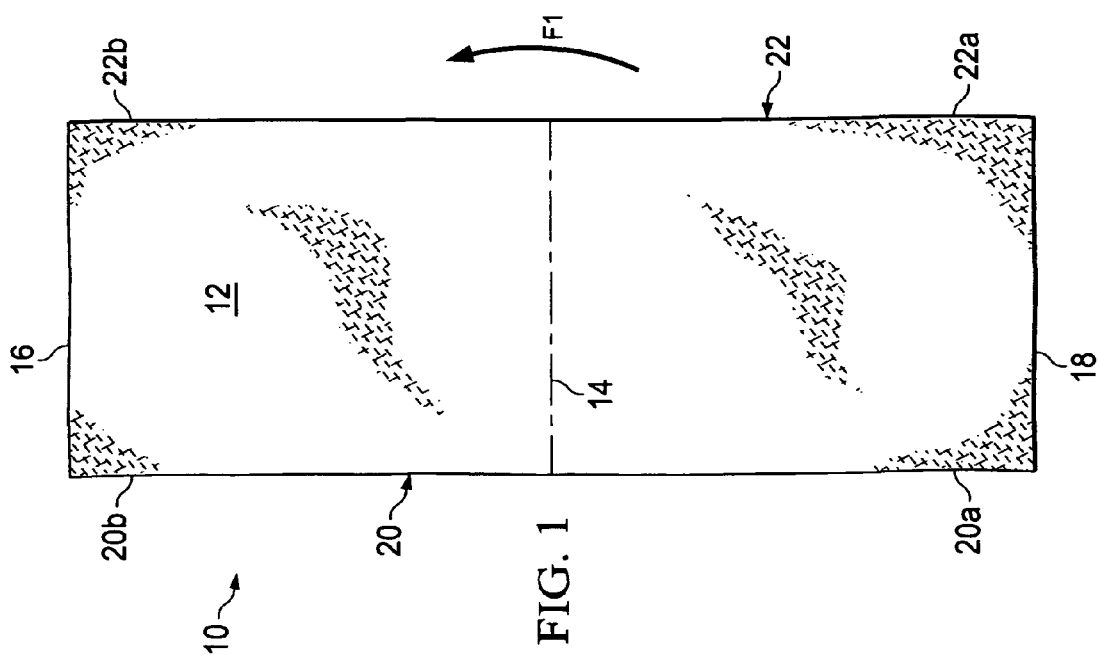

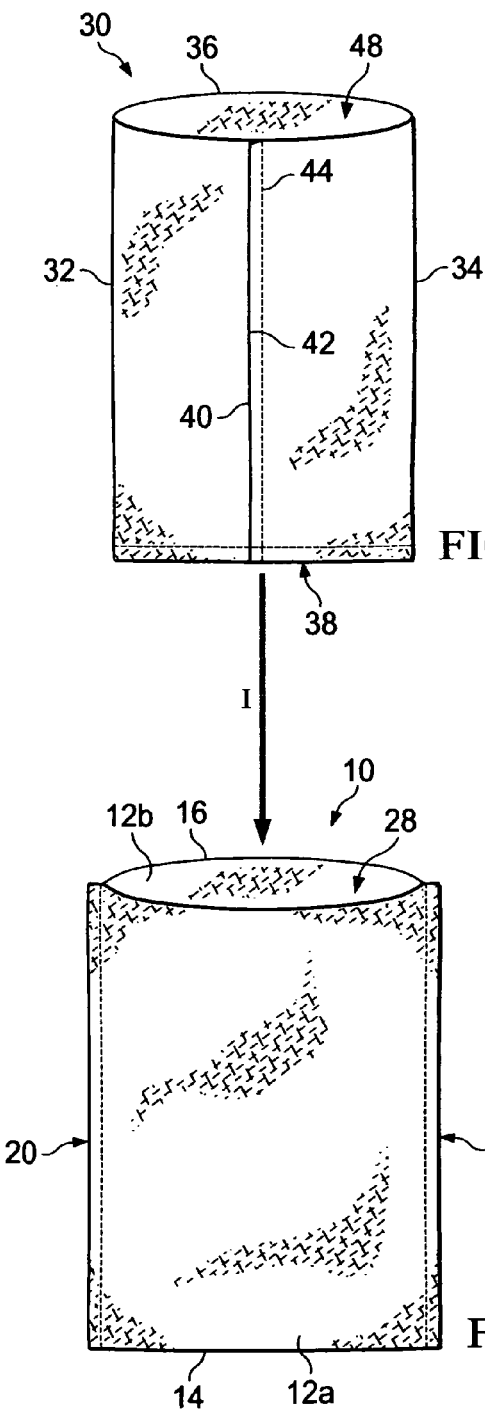
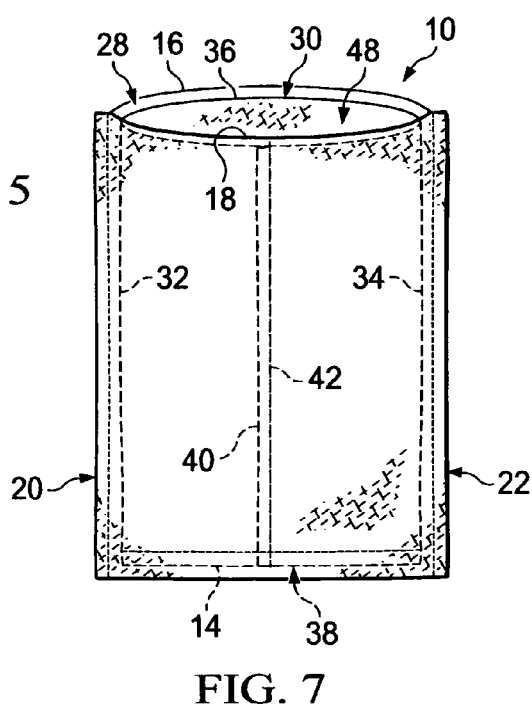
FIG. 5
FIG. 6
FIG. 7

SHIELDABLE BAG SYSTEM AND DEVICES

CROSS REFERENCE TO RELATED APPLICATIONS

The present application is a continuation-in-part (CIP) of U.S. patent application Ser. No. 13/181,673 filed on Jul. 13, 2011, which is a CIP of U.S. patent application Ser. No. 13/166,517 filed on Jun. 22, 2011, now abandoned which is a CIP of U.S. patent application Ser. No. 12/383,348 filed on Mar. 23, 2009 now abandoned and claims the benefit of Provisional Patent Application No. 61/072,986 filed Apr. 4, 2008, all of the above-referenced applications being incorporated by reference herein in their entirety.

BACKGROUND

This disclosure relates to shieldable containment devices and systems, and more particularly to reusable shieldable bags for containing items that may be carried by an individual, including a system and devices capable of blocking RF, infrared and scan technology.

There are more frequent uses of embedded storage media, such as chips, magnetic and other memory storing media in use today. For example, credit and debit cards, as well as identification cards for healthcare and insurance memberships, commonly utilize a magnetic strip that may be encoded with information. The coded stored information may be read when passed through a scanner so that a merchant or other service provider may read the information and/or import the information into a computer, such as a database or billing system. Other items, such as passports, used to identify individuals, contain digitally stored information which may read by placing the passport in the vicinity of a scanner. Also, the same scanning technology may be used to track a cell phone.

However, not only may intended decoders and readers, such as card scanners, or passport scanners read the information, but also scans may be carried out even without the individual intending or knowing that scanning is occurring. There is a great risk that information may be retrieved without authorization from a stored source, such as the aforementioned types or others, and used for unethical or unlawful purposes. In the era of increased security concerns, it is important to protect against identity thefts and espionage activities.

A need exists to avoid such scanning and tracking via an easy and economical device or system that may be used to store items which a person may generally carry on them, such as cell phones, credit and identification cards, and passports, and shield the stored contents from electromagnetic interference, such as, for example, electromagnetic radiation, including, for example, infrared, radio frequency and magnetic card decoders.

SUMMARY

One embodiment of the present disclosure provides a shielding apparatus including a double-lined container having an outer pocket and an inner pocket mounted within the outer pocket. The inner and outer pockets each form an enclosure having a continuous closed edge interrupted by an opening. The continuous closed edge of the outer pocket is adjacent the continuous closed edge of the inner pocket, and the opening of the outer pocket is adjacent the opening of the inner pocket. The adjacent openings are interconnected and include a device for simultaneously opening and closing the interconnected adjacent openings. A first plurality of stitches and folds are included in the continuous and closed edge of the inner pocket and a second plurality of stitches and folds are included in the continuous closed edge of the outer pocket. The first plurality of stitches and folds are positioned on the inner pocket so as to avoid both alignment and overlap with the second plurality of stitches and folds on the outer pocket.

BRIEF DESCRIPTION OF THE DRAWINGS

FIG. 1 is a planar view illustrating an embodiment of an unassembled portion of a shieldable bag.

FIG. 2 is perspective view illustrating an assembled portion of the shieldable bag of FIG. 1.

FIG. 5 and FIG. 6 are perspective views illustrating adjacent portions of a shieldable bag of FIG. 2 and FIG. 4 in position for assembly.

FIG. 7 is a perspective view illustrating the portion of the shieldable bag of FIG. 5 inserted into the portion of the shieldable bag of FIG. 6.

DETAILED DESCRIPTION

Figure 4:
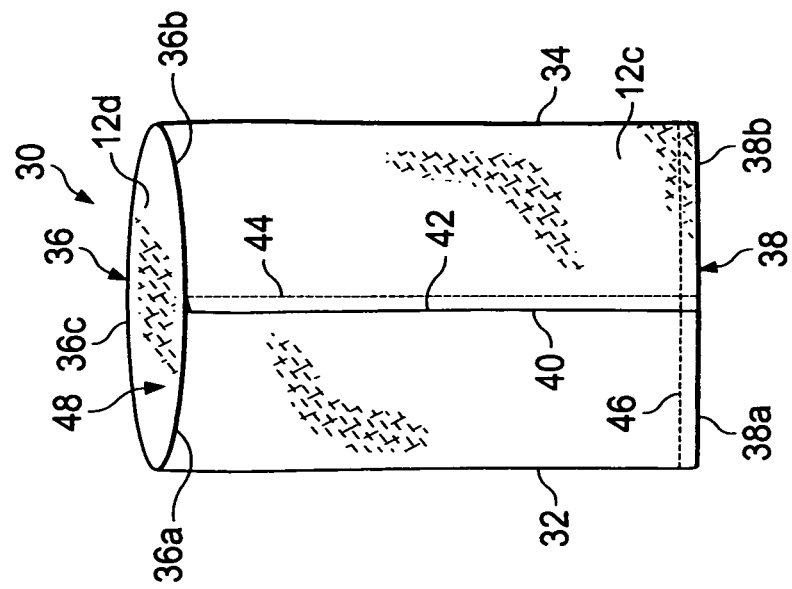
FIG. 4 is a perspective view illustrating an assembled portion of the shieldable bag of FIG. 3.

A shieldable containment device is formed of a fabric which comprises a fabric Faraday cage. Because stitching is preferably used to assemble the fabric to a desired configuration, and because the stitching penetrates and compromises the shielding capabilities of such a fabric, a novel sack configuration is required.

In FIG. 1 and FIG. 2 an embodiment of a shielding device includes an outer pocket 10 formed of a suitable material 12. Pocket 10 includes a fold line 14. Outer pocket 10 includes, as viewed in FIG. 1 and FIG. 2, a top edge 16, an opposite bottom edge 18, a first side edge 20 and an opposite side edge 22. Folding the material 12 at fold line 14, in the direction indicated by an arrow designated F1, forms a first panel 12a and a second panel 12b of material 12, and aligns top edge 16, adjacent bottom edge 18. Also, portions 20a and 20b of side edge 20 are adjacently aligned as are portions 22a and 22b of side edge 22. The side portions 20a and 20b are stitched together by stitches 24 and the side portions 22a and 22b are stitched together by stitches 26, FIG. 2. The resultant outer pocket 10 thus includes a continuous closed edge comprising in sequence, a stitched edge 20a, 20b, a folded edge along fold line 14, and a stitched edge 22a, 22b. Top edge 16 is adjacent bottom edge 18 forming an open end 28.

Figure 3:
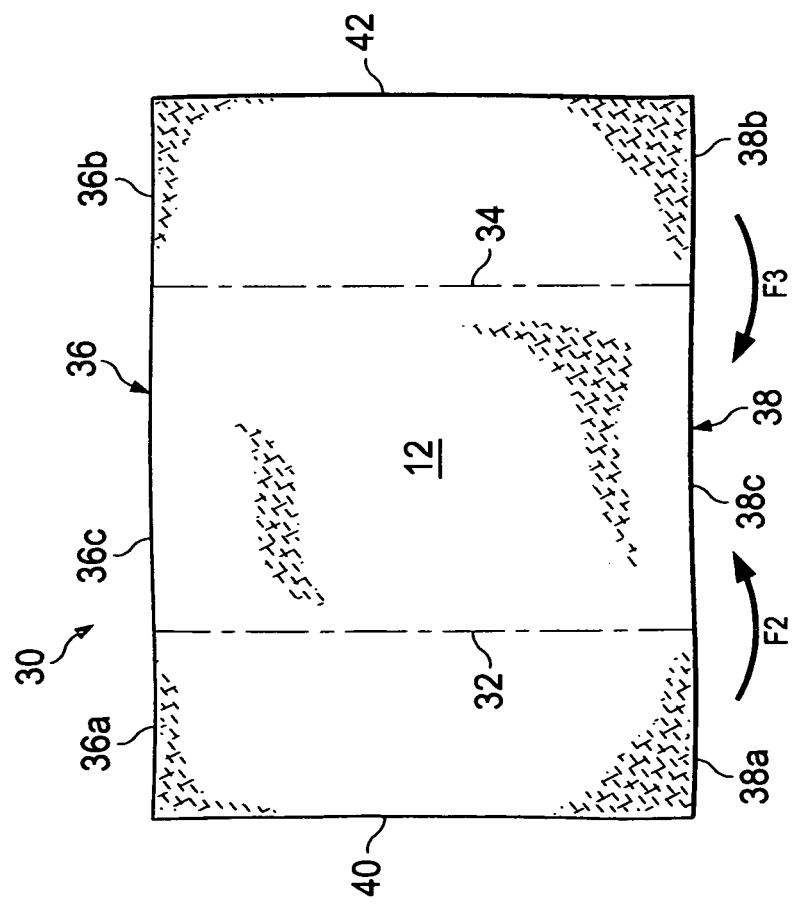
FIG. 3 is a planar view illustrating an embodiment of another unassembled portion of a shieldable bag.

In FIG. 3 and FIG. 4, another portion of the shielding device comprises an inner pocket 30, also formed of the material 12. Pocket 30 includes two fold lines 32 and 34. Inner pocket 30 includes, as viewed in FIG. 3, a top edge 36, an opposite bottom edge 38, a first side edge 40 and an opposite side edge 42. Folding the material 12 at fold lines 32 and 34, FIG. 4, in the direction indicated by a pair of respective arrows designated F2 and F3 forms a first panel 12c and a second panel 12d of material 12, aligns side edges 40, 42, aligns portions 36a, 36b of top edge 36 adjacent a portion 36c of top edge 36, and aligns portions 38a, 38b of bottom edge 38 adjacent a portion 38c of bottom edge 38. The adjacent edges 40, 42 are stitched together by stitches 44 and portions 38a, 38b are stitched to portion 38c by stitches 46. The resultant inner pocket 30 thus includes a continuous closed edge comprising in sequence, a folded edge along fold line 32, a stitched edge 38 formed by portions 38a, 38b, 38c, and another folded edge along fold line 34. Top edge portion 36c is adjacent top edge portions 36a, 36b forming an open end 48.

The outer pocket 10 and the similar sized inner pocket 30 being constructed as described above, may be joined to form an effective shielding device. The inner pocket 30 may be mounted within the outer pocket 10 by inserting the inner pocket 30 in the outer pocket 10 in the manner described below.

As mentioned above, stitching of the fabric compromises the shielding capabilities of the fabric. This stitching used in the inner and outer pockets may permit leakage of signals into or out of the shielding device when stitches used in the outer pocket 10 are aligned with or immediately adjacent to stitches used in the inner pocket 30. However, as will be seen, the stitches used in the inner pocket 30 are neither aligned with nor immediately adjacent the stitches used in the outer pocket 10.

More specifically, FIGS. 5, 6 and 7, inner pocket 30 including a continuous closed edge of a first sequence comprising a folded edge along fold line 32, a stitched edge 38 including portions 38a, 38b and 38c, (see also FIG. 3) and another folded edge along fold line 34, may be inserted in outer pocket 10 and oriented so that the outer pocket folded and stitched edges are of a second sequence, different from the first sequence. That is, the continuous closed edge of the outer pocket 10, having a stitched edge 20 including portions 20a, 20b, (see also FIG. 1) a folded edge along fold line 14 and a stitched edge 22 including portions 22a, 22b, (also in FIG. 1) is in the second sequence, such that the folded edge along fold line 32 of inner pocket 30 is immediately adjacent the stitched edge 20 of the outer pocket 10, the stitched edge 38 of inner pocket 30 is immediately adjacent the folded edge along fold line 14 of outer pocket 10, and the folded edge along fold line 34 of inner pocket 30 is immediately adjacent the stitched edge 22 of outer pocket 10.

It should also be mentioned that edges 40, 42, stitched together by stitches 44 are not a part of the continuous closed edge of inner pocket 30 and thus, stitches 44 are positioned adjacent panel 12a of outer pocket 10, and are not adjacent any of the stitched edges of outer pocket 10. Furthermore, as can be seen, when inner pocket 30 is fully inserted into outer pocket 10, in the direction of an arrow designated I, FIGS. 5, 6 and 7, the respective edges 16 and 18 of outer pocket 10 and inner edge 36 of pocket 30, are immediately adjacent one another as are their respective openings 28 and 48.

Figure 8:
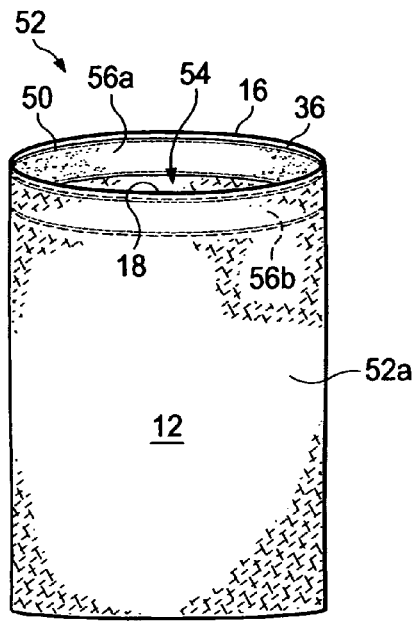
FIG. 8 is a perspective view illustrating an embodiment of the assembled shieldable bag having an opening at one end.

The adjacent open edges 16, 18 and 36, FIG. 8, are stitched together at 50, forming a double lined containment device 52 having a single opening 54. Means 56a and 56b are provided for simultaneously opening and closing the now single opening 54. Again, in FIG. 8, the means 56 for opening and closing may comprise a commercially available Velcro® brand hook 56a and loop 56b fastening device suitably secured around the inner periphery of the single opening 54.

Because stitching 50 of the fabric 12, described above, at the single opening 54 may compromise the shielding capabilities of fabric 12, what is required is an appropriate closure of containment device 52 in addition to the hook 56a and loop 56b fastening means.

Figure 9:
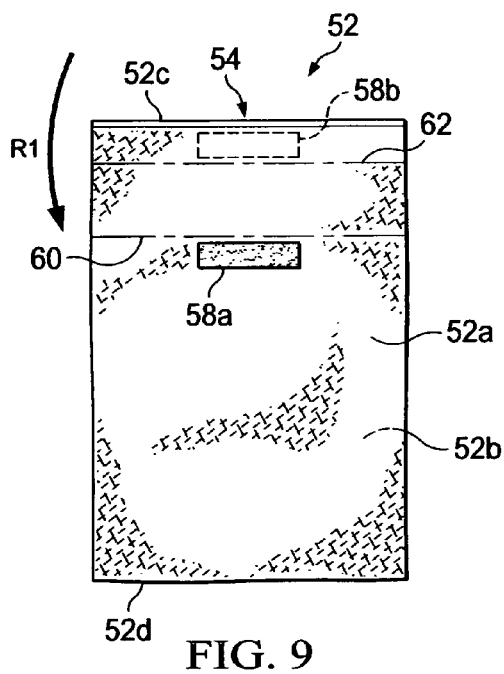
FIG. 9 is a planar view illustrating an embodiment of the shieldable bag having the opening of FIG. 8 in a closed position.
Figure 10:
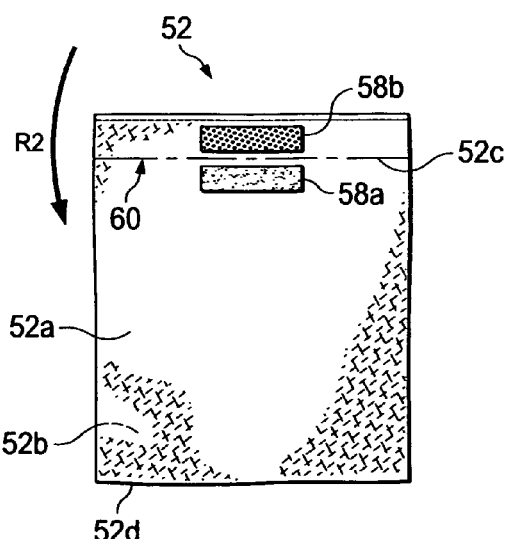
FIG. 10 is a planar view illustrating the closed end of FIG. 9 in a first folded position.

To accomplish this closure, a double fold system is provided so that the closure of containment device 52 may further seal against penetrating and/or leaking signals. In FIG. 9, opening 54 is closed. Additional closure means may include an additional hook member 58a and loop member 58b. For example, hook fastener member 58a may be provided on a first side 52a of a containment device 52 positioned below a fold line 60, see FIG. 9 and FIG. 10. Loop fastener member 58b may be provided on a second side 52b, opposite side 52a adjacent another fold line 62.

The double fold system may be accomplished by folding a top end 52c of containment device 52 at fold line 62 180° toward a bottom end 52d in a first rotating motion as indicated by the arrow designated R1. The rotating motion positions loop member 58b adjacent first side 52a of containment device 52 and immediately adjacent hook member 58a, see FIG. 10. Next, FIG. 11, the top end is folded again at fold line 60 another 180° toward the bottom and 52d in a second rotating motion as indicated by the arrow designated R2. The second rotating motion engages loop fastener member 58b with hook fastener member 58a in a superimposed manner and hidden by the last mentioned fold.

Figure 11:
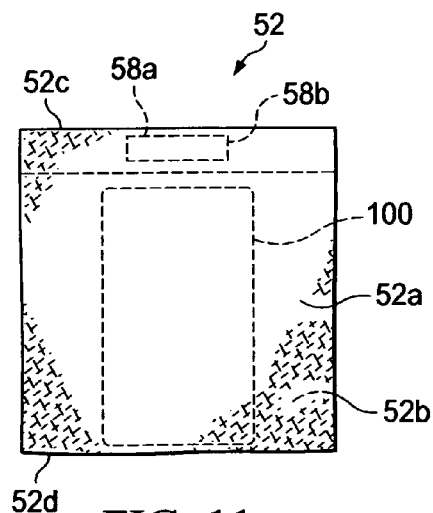
FIG. 11 is a planar view illustrating the closed and folded end of FIG. 10 in a double folded position.

According to the above, a personal device 100, FIG. 11, contained in the containment bag 52, is shielded by the fabric faraday cage described above so that all signals are blocked from entering or leaking from the bag 52. The multiple thickness fabric bag 52 is usable with mobile devices including, but not limited to Smartphones, tablets and I Pads. When such a device is placed in the bag 52, and the bag is folded closed, the device and its file contents become invisible. Phones will not ring. Items with ID chips cannot be scanned. Vital information is secure and tracking is impossible. This is important because the I Phone has a tracking device that cannot currently be turned off. Once placed inside the bag 52, personal information is guarded and personal identity is protected from being read, scanned, or intercepted by skimming devices. A preferred material which may be used to make the bag 52 is the product "Silver Plated Nylon Rip Stop Fabric" supplied by the Carolina Silver Co. of Maiden, N.C. The material used for stitching may be any suitable thread which is commercially available.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A shield apparatus comprising:
   a double-lined container having an outer pocket and an inner pocket mounted within the outer pocket;
   the inner and outer pockets each forming an enclosure having a continuous closed peripheral edge interrupted by an opening;
   the continuous closed peripheral edge of the outer pocket being adjacent the continuous closed peripheral edge of the inner pocket, and the opening of the outer pocket being adjacent the opening of the inner pocket;
   the adjacent openings being inter-connected and including means for simultaneously opening and closing the inter-connected adjacent openings;

the outer pocket comprising a single folded portion extending along the peripheral edge of the outer pocket and a pair of parallel spaced-apart stitched edge portions extending along the peripheral edge of the outer pocket; and the inner pocket comprising a pair of parallel spaced-apart folded portions extending along the peripheral edge of the inner pocket and a first stitched edge portion; a second stitched portion extending between the the first edge stitched portion and the opening of the inner pocket, the inner pocket being oriented within the outer pocket so that the spaced-apart stitched edge portions of the outer pocket are immediately adjacent the spaced-apart folded portions of the inner pocket, and the single folded portion of the outer pocket is immediately adjacent the first stitched edge portion of the inner pocket.

2. The apparatus as claimed in claim 1, further compromising:
means for maintaining the adjacent openings in a folded position.

3. The apparatus as claimed in claim 1 wherein the adjacent openings are maintained in a multiple folded position.

4. The apparatus as claimed in claim 1 wherein the second stitched portion of the inner pocket is parallel to and positioned between the spaced-apart folded portions of the inner pocket.

5. A shielding apparatus comprising:
a container having an outer pocket and an inner pocket mounted within the outer pocket;
the inner pocket having a continuous peripheral edge including an open first end;
the outer pocket having a continuous peripheral edge including an open first end adjacent the inner pocket first end;
the adjacent first ends being interconnected and including means for simultaneously opening and closing the interconnected first ends;
the inner pocket peripheral edge having a closed second end and closed opposite sides;
the outer pocket peripheral edge having a closed second end adjacent the inner pocket closed second end and having closed opposite sides adjacent the respective closed opposite sides of the inner pocket,
the outer pocket comprising a single folded portion extending along the closed second end of the peripheral edge of the outer pocket and a pair of parallel spaced-apart stitched edge portions extending along the closed opposite sides of the peripheral edge of the outer pocket; and
the inner pocket comprising a pair of parallel spaced-apart folded portions extending along the closed opposite sides of the peripheral edge of the inner pocket and a first stitched edge portion extending along the closed second end of the peripheral edge of the inner pocket and further including a second stitched portion extending between the first stitched portion and the first end of the inner pocket, the inner pocket being oriented within the outer pocket so that the spaced-apart stitched edge portions of the outer pocket are immediately adjacent the spaced-apart folded portions of the inner pocket, and the single folded portion of the outer pocket is immediately adjacent the first stitched edge portion of the inner pocket.

6. The apparatus as claimed in claim 5 further comprising:
means for maintaining the adjacent first ends in a folded position.

7. The apparatus as claimed in claim 5 wherein the adjacent first ends are maintained in a multiple folded position.

8. The apparatus as claimed in claim 5 wherein the adjacent first ends are folded toward the adjacent closed second ends.

9. The apparatus as claimed in claim 5 wherein the second stitched portion of the inner pocket is parallel to and positioned between the spaced-apart folded portions of the inner pocket.

* * * * *